(12) United States Patent
Pullmann et al.

(10) Patent No.: US 7,504,747 B2
(45) Date of Patent: Mar. 17, 2009

(54) SAFETY SWITCH FOR RELIABLY SWITCHING OFF A DANGEROUS DEVICE

(75) Inventors: Jürgen Pullmann, Ebersbach (DE);
Christoph Zinser, Wolfschlugen (DE);
Klaus Stark, Weilheim/Teck (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 11/404,073

(22) Filed: Apr. 13, 2006

(65) Prior Publication Data

US 2006/0214515 A1    Sep. 28, 2006

Related U.S. Application Data

(63) Continuation of application No. PCT/EP2004/009081, filed on Aug. 13, 2004.

(30) Foreign Application Priority Data

Oct. 14, 2003    (DE) ................ 103 48 884

(51) Int. Cl.
*H01H 35/00* (2006.01)

(52) U.S. Cl. ................ 307/117; 307/326; 335/205

(58) Field of Classification Search ............ 340/686.1; 192/129 A; 200/334, 341; 361/180, 170; 307/98, 104, 116, 117, 326; 335/205
See application file for complete search history.

(56) References Cited

U.S. PATENT DOCUMENTS

| | | | | |
|---|---|---|---|---|
| 4,675,481 A * | 6/1987 | Markowski et al. | ............ | 218/1 |
| 6,160,323 A | 12/2000 | Mayr et al. | | |
| 6,352,045 B1 * | 3/2002 | Takashima | ................. | 114/55.5 |
| 6,409,083 B1 | 6/2002 | Link | | |
| 6,680,446 B1 * | 1/2004 | Saxer et al. | ............ | 200/61.71 |
| 6,801,112 B1 * | 10/2004 | Saxer | ......... | 335/205 |
| 6,989,727 B2 * | 1/2006 | Bachle | ......... | 335/205 |
| 7,176,799 B1 * | 2/2007 | Golicz et al. | ............ | 340/572.1 |
| 7,205,872 B2 * | 4/2007 | Baechle et al. | ............ | 335/207 |
| 2004/0100440 A1 * | 5/2004 | Levin et al. | ............ | 345/156 |

(Continued)

FOREIGN PATENT DOCUMENTS

DE     34 30 090 A1    3/1986

(Continued)

OTHER PUBLICATIONS

Die Bibliothek der Technik Bank 232; "Sicherheitsschaltgeraete" (Safety Switching Devices), ISBN 3-478-93234-3; 8 pages.

*Primary Examiner*—Stephen W Jackson
*Assistant Examiner*—Daniel Cavallari
(74) *Attorney, Agent, or Firm*—Harness, Dickey & Pierce, P.L.C.

(57) ABSTRACT

A safety switch for reliably switching off a dangerous device has an actuator which can be moved between a first position and at least one second position. It also has a detector for detecting the actuator in at least one of the said positions. The detector comprises a transponder with an individual transponder identification and a reading unit for reading out the transponder identification. The transponder and the reading unit are arranged relative to one another such that the reading unit is capable of reading out the transponder in the first position of the actuator but not in its second position.

18 Claims, 5 Drawing Sheets

U.S. PATENT DOCUMENTS

| | | | |
|---|---|---|---|
| 2005/0156752 A1* | 7/2005 | Finkenzeller et al. | 340/693.3 |
| 2006/0181417 A1* | 8/2006 | Pullmann et al. | 340/545.2 |
| 2006/0214515 A1* | 9/2006 | Pullmann et al. | 307/326 |
| 2006/0220846 A1* | 10/2006 | Stratmann | 340/545.2 |
| 2007/0013236 A1* | 1/2007 | Fleiner et al. | 307/326 |
| 2007/0090694 A1* | 4/2007 | Pullmann et al. | 307/112 |
| 2007/0091518 A1* | 4/2007 | Pullmann et al. | 361/23 |
| 2007/0204662 A1* | 9/2007 | Pullmann et al. | 70/277 |

FOREIGN PATENT DOCUMENTS

| | | |
|---|---|---|
| DE | 34 40 027 A1 | 5/1986 |
| DE | 38 41 458 C1 | 5/1990 |
| DE | 42 33 922 A1 | 5/1994 |
| DE | 197 11 588 A1 | 9/1998 |
| DE | 199 09 968 A1 | 9/1999 |
| DE | 199 02 910 A1 | 8/2000 |
| DE | 199 02 919 A1 | 8/2000 |
| DE | 199 17 212 A1 | 11/2000 |
| DE | 100 23 199 A1 | 1/2001 |
| DE | 199 37 947 A1 | 3/2001 |
| DE | 100 00 799 C1 | 5/2001 |
| DE | 199 28 641 C1 | 5/2001 |
| DE | 100 37 003 A1 | 2/2002 |
| DE | 102 48 640 A1 | 4/2004 |
| EP | 0 229 247 A2 | 7/1987 |
| EP | 0 968 567 | 1/2000 |

* cited by examiner

SAFETY SWITCH FOR RELIABLY SWITCHING OFF A DANGEROUS DEVICE

CROSSREFERENCES TO RELATED APPLICATIONS

This application is a continuation of international patent application PCT/EP2004/009081, filed on Aug. 13, 2004 and published in German language, which claims priority under the Paris Convention from German patent application DE 103 48 884.7 filed on Oct. 14, 2003.

BACKGROUND OF THE INVENTION

The present invention relates to mechanically operated safety switches, and more particularly to mechanically operated one-part switches, such as emergency stop switches ("mushroom buttons"), manual enabling buttons, position or limit switches, and other safety switches mechanically operated by means of levers, rollers, hinges or the like.

Prior art safety switches of this type are often used in automated installations in order to bring the installation into a safe state if a dangerous situation occurs. This may be, for example, that the installation is switched off when an emergency stop switch is manually operated. Depending on the application, however, is also possible that a safe inactive position is adopted or a partial function of the installation is blocked. Examples of safety switches of this type are disclosed by DE 38 41 458 C1, DE 199 02 910 A1, DE 199 02 919 A1, DE 199 37 947 A1 or DE 34 30 090 A1.

The prior art safety switches known heretofore share the common feature that they have a mechanically operated actuator, the respective position of which is monitored by means of a detector. In practice, the detectors until now have been formed as electromechanical switching elements, the contacts of which are opened or closed by the movable actuator. For safety switches, so-called positive opening arrangements are usually used, ensuring opening of the safety switch even when there is a malfunction in the safety switch itself, as for instance in the case of the contacts sticking in the closed position. These safety switches, particularly emergency stop switches, can be produced quite inexpensively and reliably on account of the many years of experience and on account of the high numbers involved.

In practice, however, "faith" in the functional reliability of the safety switches is nevertheless limited. For example, in the case of production installations for the automobile industry, there is a requirement that all the emergency stop switches must be manually operated at least once or twice a year in order to check their functional reliability. It is easy to see that, in the case of extensive, large installations with numerous emergency stop switches, these functional checks take up a certain amount of time and consequently a certain amount of effort. Therefore, apart from the low production costs for an emergency stop switch, there are over the service life of the installation in which the emergency stop switch is used operating costs for the regular functional checking.

DE 199 09 968 A1 discloses a safety switch for electrically-controlled machines in which the position of the movable actuator is to be evaluated by means of a number of fork light barriers. Alternatively, inductive, capacitive or pressure-sensitive, for example piezoelectric, position sensing devices are also proposed, but without any further explanation. The object of these measures is to avoid a complex mechanism for the prevention of unallowed switching sequences and, at the same time, achieve a high functional reliability.

DE 100 23 199 A1 discloses a safety switch for electrical machines which has a force or pressure sensor, so that it is possible to distinguish between a desired or intended operating state and a state of panic.

Furthermore, DE 100 37 003 A1 discloses a key-operated switch which is intended for checking access authorization in computer-aided control devices of machines, installations or the like. Instead of a mechanical key, use of a transponder is envisaged to establish the access authorization.

The last-mentioned key-operated switch is also shown in a book with the title "Sicherheitsschaltgeräte" [Safety Switching Devices], published by Verlag Moderne Industrie as volume 232 of the series "Bibliotek der Technik", ISBN 3-478-93234-3. As a general outlook for the technical development in this area, mention is also made here of the idea of integrating in an enabling switch a transmitter which, when operated, transmits a unique code to an assigned receiver by radio data communication, whereby the previously often troublesome cables for enabling switches are to be rendered superfluous.

Furthermore, EP 0 229 247 A2 or EP 0 968 567 B1 discloses signal transmitters operating contactlessly (that is per se two-part, non-mechanically operated signal transmitters), which also operate on the transponder principle. These contactless signal transmitters are to be used, inter alia, for the monitoring of guard doors.

SUMMARY OF THE INVENTION

Against this background, it is an object of the present invention to provide for a reliable and inexpensive safety switch capable of being tested without outside mechanical operation, in order thereby to reduce the effort for external functional checks.

According to an aspect of the invention, this object is achieved by a mechanically operated, one-part safety switch for reliably switching off a dangerous device, the safety switch comprising: a mechanically operated actuator moveable between a first position and at least one second position, a detector for detecting the actuator in at least one of the said positions, the detector comprising a transponder having an individual transponder identification and comprising a reading unit designed for reading out the transponder identification, wherein at least one of the transponder and the reading unit is movable as a function of the actuator, and wherein the transponder and the reading unit are arranged relative to one another in such a way that the reading unit is capable of reading out the transponder in the first position but not in the second position.

Accordingly, the novel safety switch has a transponder which is generally arranged separate from the reading unit. For reading out the transponder identification, the reading unit and the transponder communicate wirelessly with one another, i.e. by means of at least one electromagnetic signal. The arrangement of the transponder, the reading unit and the movable actuator is chosen such that the wireless communication breaks off (is prevented) if the actuator is moved from the first position into the second position. In other words, the wireless communication is only possible here if the actuator is in the first position. Depending on whether or not the reading unit can read out the transponder identification, the position of the actuator can then be determined.

By means of such an arrangement, it is surprisingly possible to reliably monitor the position of the actuator, and thus the operating state, even in the case of a mechanically operated, so to say one-part, safety switch (as distinct from signal transmitters operating contactlessly, that is per se two-part signal transmitters). This was not to be expected at the outset due to the small distances traveled by the actuator when it moves in the case of such safety switches. Practical tests have now shown, however, that it is also possible for transponders to be advantageously used for evaluating the operating state in the case of one-part, mechanically operated safety switches.

Due to the individual transponder identification, the use of a transponder already intrinsically has a greater immunity to manipulations and false detections than, for example, fork light barriers and other previously known detectors. Since the communication between the transponder and the reading unit is also a more dynamic process, which is constantly repeated, any malfunction within the safety switch is automatically detected.

In addition, in the case of a transponder it is easily possible to interrupt the communication between the transponder and the reading unit intentionally, without the actuator having to be mechanically operated. Therefore, the novel safety switch can be tested for its functional capability in an "electronic" manner, which makes it at least basically possible to reduce or even eliminate the heretofore customary manual functional checks.

The novel safety switch additionally has the advantage that it is possible to dispense with the use of detectors with contacts, for which reason the novel safety switch can operate free from wear. On the other hand, it is still possible to use a switching element with contacts as a detector along with a transponder, in particular to maintain compatibility with existing safety switches. Furthermore, a diversitary redundancy would be created in this case, once again making increased functional reliability possible.

As a further advantage, the novel safety switch can be wirelessly connected quite easily to a higher-level evaluation unit due to the proposed transponder identification. This reduces the amount of cabling, particularly in the case of extensive installations.

In a preferred refinement of the invention, the novel safety switch additionally has a first shielding element for selective shielding of electromagnetic signals, the shielding element and the transponder and/or the reading unit being movable relative to one another in dependence on the actuator.

By means of such a shielding element, the propagation path of electromagnetic waves on which the wireless communication between the transponder and the reading unit is based can be selectively limited. As a consequence, the response of the novel safety switch becomes more controlled in this refinement, which contributes to a further increase in the functional reliability. Furthermore, on account of the use of such a shielding element, the detectable switching path of the actuator can be significantly reduced, so that the first and second positions, which have to be differentiated from one another, can lie spatially very close together. As a consequence, the overall size of the novel safety switch can be reduced. Furthermore, the greater sensitivity leads to a faster, and also more reliable, function.

In another refinement, the first position represents the inactive position of the actuator.

This is particularly advantageous for use as an emergency stop switch, since failure of the active, dynamic transponder signal hereby leads automatically to the switching-off of the monitored installation. The evaluation and installation of the novel safety switch is simplified as a result.

In a further refinement, the transponder is arranged on the movable actuator. The transponder is preferably formed as a passive transponder here.

Passive transponders, i.e. those which are operational without an energy source of their own, have already been commercially available for some time. They are used for example in immobilizers for motor vehicles or for the identification of individual animals in factory farming. On account of the high numbers thereby involved, passive transponders are available as low-cost components. A passive transponder can be fastened very easily to the movable actuator, for example adhesively bonded, which makes low-cost production possible. In addition, the position of the actuator can be determined very reliably in this refinement, since the transponder inevitably moves along with the actuator.

In a further refinement, the first shielding element has a clearance, which in the first position of the actuator lies on a substantially straight connecting line between the transponder and the reading unit.

In this refinement, the first shielding element operates to a certain extent as a pinhole diaphragm, through which the communication between the transponder and the reading unit takes place. If only one of the three elements, that is to say either the transponder and/or the reading unit and/or the clearance of the shielding element, is displaced in relation to the others, the communication breaks down very quickly. By suitable dimensioning the clearance ("pinhole diaphragm"), the switching behavior of the novel safety switch can be implemented very exactly. In addition, it is possible in this refinement to encapsulate the transponder and/or the reading unit largely or even completely in the shielding element, whereby the functional reliability of the novel safety switch is further increased.

In a further refinement, the first shielding element is arranged on the actuator. Accordingly, the first shielding element can be rigidly fastened to the actuator, for example, so that it follows its movements. Furthermore, the first shielding element can also be part of the actuator, i.e. the actuator also acts at the same time as the first shielding element.

This kind of coupling of the shielding element and the actuator is a simple way of achieving a breakdown of the communication between the transponder and the reading unit by displacing the actuator. The actuator acts in this case to a certain extent as a gate which only clears a communication path between the transponder and the reading unit in the opened state, but not in the closed state. The refinement has the advantage that both the transponder and the reading unit can be arranged such that they are fixed in place in the safety switch, which increases the degrees of freedom in practical implementation. In particular, optimization of the response is possible as a result, by choosing the distance between the transponder and the reading unit.

In a further refinement, the first shielding element has a portion which runs substantially transversely in relation to a direction of movement of the actuator and which has an opening for the actuator to pass through.

In this refinement, when the safety switch is operated, the actuator enters a region shielded by the first shielding element. Since the first shielding element can be rigidly fastened to a wall of a support or housing in contrast to the actuator, the shielding element can be formed with a relatively large surface area. Advantageously, the shielding effect can thus be optimized with regard to maximum functional reliability.

In a further refinement, the first shielding element has a signal path for the defined transmission of an electromagnetic signal.

This refinement is based on the idea of providing a single defined transmission path only for the communication between the transponder and the reading unit, rather than blocking possible undesired transmission paths by a shielding element at a later stage of the construction. The signal path may be implemented for example in the form of a waveguide, from which the transmitted signals can emerge only at selected points. This measure allows particularly high functional reliability to be achieved.

In a further refinement, the transponder is arranged in a second shielding element, preferably in a shielding bush that is open on one side.

In yet a further refinement, the reading unit has a receiving coil, which is arranged in a third shielding element.

These two refinements allow the functional reliability of the novel safety switch to be further increased, since the transmitting and receiving characteristics of the transponder and the reading unit are focused on an even narrower range. In particular, this measure makes it possible to prevent communication from occurring via side lobes in the respective transmitting characteristics. The accuracy of the response of the novel safety switch is further increased.

In a further refinement, the shielding elements are electrically conductive, non-ferromagnetic shielding elements, preferably of aluminum, copper, silver, gold or a combination of these.

As an alternative to this, electromagnetic waves can, as known, also be influenced by magnetically effective shielding elements, such as for instance ferrites. However, it has been found that, with the typical distances and frequencies that occur here on account of the specified intended use, electrically conductive, magnetically largely ineffective shielding elements are more effective. The shielding can therefore take place more precisely. The functional reliability is further increased.

In a further refinement, the novel safety switch has a switching element, by means of which the reading out of the transponder identification can be selectively suppressed. The switching element is preferably arranged in the region of the reading unit.

By means of such a switching element, a test function can be implemented in a simple way. In particular, a higher-level control device can cyclically suppress the reading out of the transponder identification in order to check whether the novel safety switch responds appropriately. This allows to form the safety circuit with the novel safety switch as a one channel implementation, so that fewer components and less installation space are required. In addition, the manual checking carried out in the case of the previous safety switches might be carried out in an automated manner in this refinement, which makes it easier for the novel safety switch to comply with prescribed standards and gain acceptance.

In a further refinement, the safety switch has a pressure sensor, by means of which an operating pressure on the actuator can be detected.

With such a pressure sensor, the operation of the novel safety switch can be detected in a redundant manner with respect to the evaluation of the position of the actuator. Accordingly, functional reliability is further increased. In addition, such a pressure sensor offers the possibility of detecting operation of the new safety switch even when the actuator for example jams or is otherwise prevented from moving. With a pressure sensor, the novel safety switch can also be used in areas in which high levels of contamination occur, for example in painting installations, which can impair mechanical operation.

In a further refinement, the actuator is produced from a non-corroding material and/or is encapsulated in a dust-free manner.

These refinements also contribute to preventing immobility of the actuator, which allows a corresponding exclusion of malfunctions. The frequency of manual functional checks can further be reduced.

It goes without saying that the features mentioned above and still to be explained below can be used not only in the respectively specified combination but also in other combinations or on their own without departing from the scope of the present invention.

BRIEF DESCRIPTION OF THE DRAWING

Exemplary embodiments of the invention are explained in more detail in the description which follows and are represented in the drawing, in which.

DESCRIPTION OF PREFERRED EMBODIMENTS

Figure 1:
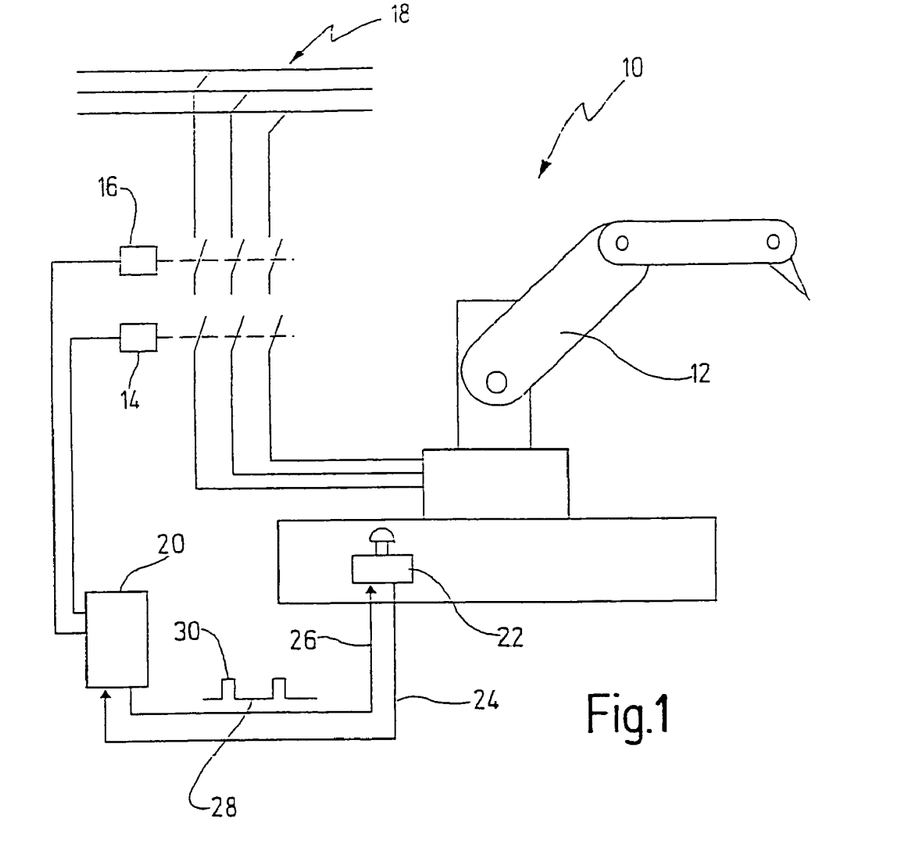
FIG. 1 shows a simplified representation of an installation operating in an automated manner, in which an exemplary embodiment of the novel safety switch is used.

In FIG. 1, an installation operating in an automated manner, in which an exemplary embodiment of the novel safety switch is used, is designated as a whole by reference numeral 10.

The installation 10 here comprises by way of example a robot 12. However, the invention is not restricted to this and can equally be used in other installations in which mechanically operated safety switches are used.

The robot 12 is connected here, in a way known per se, to a power supply 18 via two contactors 14, 16. The normally open contacts of the contactors 14, 16 lie in series with one another, in order to implement redundant disconnection paths. The contactors 14, 16 are activated by a safety switching device 20 or some other suitable safety control. According to an exemplary embodiment of the invention, an emergency stop switch 22 is connected to the safety switching device 20 on the input side. Use as an emergency stop switch is a preferred exemplary embodiment of the invention. However, the invention is not restricted to this and can equally be used in the case of other mechanically operated (one-part) safety switches.

The emergency stop switch 22 supplies an output signal to the safety switching device 20 via a connection 24 and receives a control signal 28 with test pulses 30 from it via a second connection 26. Consequently, the safety switching device 20 has the possibility of checking the emergency stop switch 22 for its functional capability, as explained in still more detail below. If, on the basis of the connection 24 to the emergency stop switch 22, the safety switching device 20 detects an undefined or uncertain state or if the emergency stop switch 22 is manually operated and a corresponding signal is sent to the safety switching device 20 via the connection 24, the safety switching device 20 switches off the robot 12 via contactors 14, 16.

Figure 2:
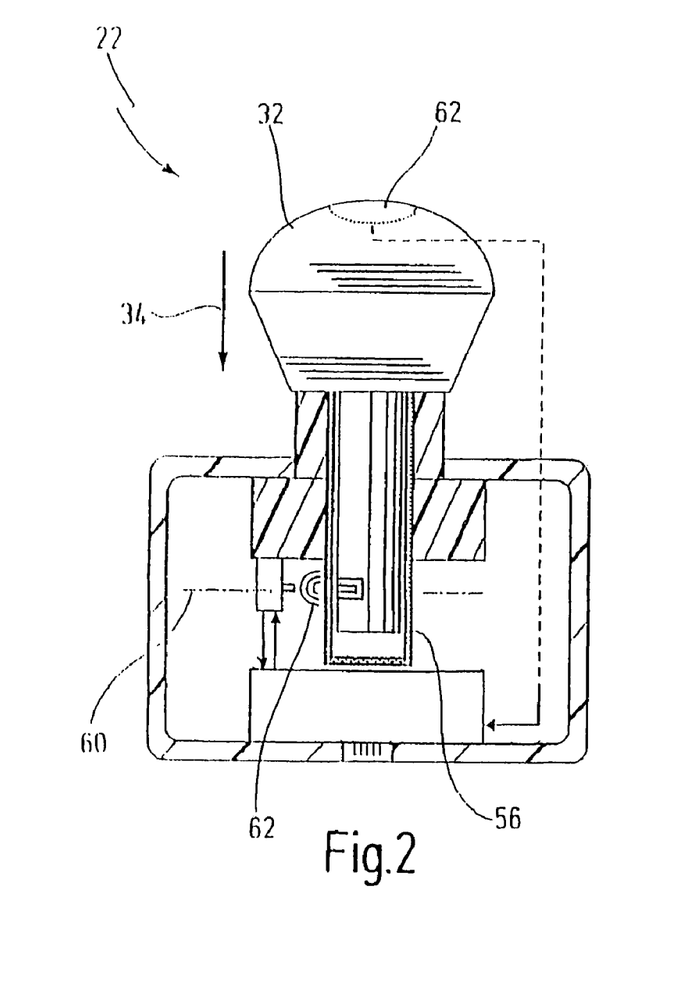
FIGS. 2 and 3 show an exemplary embodiment of the novel safety switch in two different operating positions.
Figure 3:
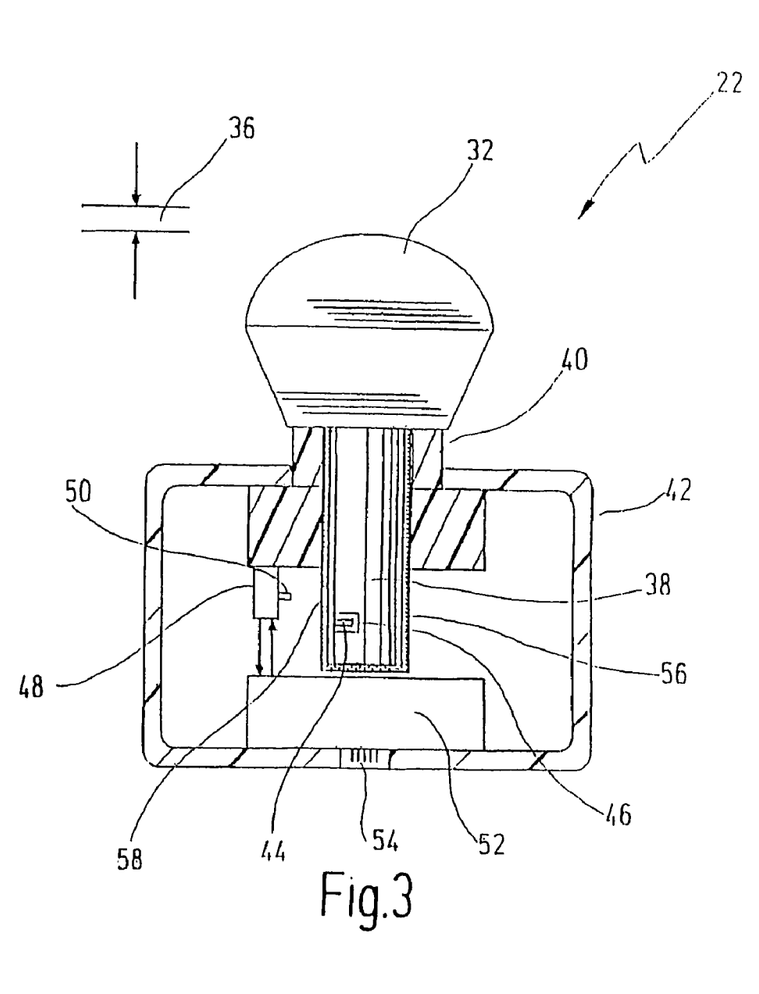

In FIGS. 2 and 3, the emergency stop switch 22 is represented in its two possible operating states. FIG. 2 shows the emergency stop switch 22 in the inactive or non-operated state. FIG. 3 shows the emergency stop switch 22 after it has been operated. When operated, the operating button 32 of the emergency stop switch 22 was pressed downward in the direction of the arrow 34. The travel associated with the movement is indicated in FIG. 3 by the reference numeral 36.

The emergency stop switch 22 has an actuator 38 rigidly connected to the operating button 32. The actuator 38 is mounted movably in the direction of the arrow 34 in a receptacle 40, which for its part is fastened to a switch housing 42. Arranged at the free end of the actuator 38 is a commercially available, passive transponder 44, the functional mode of which is explained in still more detail below on the basis of FIG. 4. According to a preferred exemplary embodiment, the transponder 44 is adhesively bonded here in a shielding bush 46, which surrounds the transponder 44 in a tubular manner and is open only on one side (namely the left side in FIGS. 2 and 3).

A reading unit for reading out the transponder 44 is designated by reference numeral 48. The reading unit 48 is sometimes referred to in technical terminology as a tag reader, and it has on its side facing the transponder 44 a receiving coil 50, by which it communicates wirelessly with the transponder 44.

An evaluation logic, which activates the reading unit 48 and picks up its output signals is designated by the reference numeral 52. As a departure from the way in which it is represented here in the manner of a functional block, the reading unit 48 with the receiving coil 50 and the evaluation logic 52 may also be connected in a combined circuit.

A connection socket for connecting the connections 24, 26 (FIG. 1) is designated by reference numeral 54. As an alternative to this, the emergency stop switch 22 might communicate wirelessly with the safety switching device 20 or a corresponding safety controller on account of the inventive use of a transponder.

A shielding element, which surrounds the actuator 38 here in the manner of a sleeve, is designated by reference numeral 56. The shielding element 56 has a clearance 58, which is arranged in such a way that, in the inactive state of the emergency stop switch 22, it lies on an imaginary connecting line 60 between the reading unit 48 (to be more precise its receiving coil 50) and the transponder 44. As a consequence, in the inactive state of the emergency stop switch 22, wireless communication between the transponder 44 and the reading unit 48 is possible, which is indicated in FIG. 2 by the reference numeral 62.

If, on the other hand, the actuator 38 is in the position shown in FIG. 3, the transponder 44, the receiving coil 50 and the clearance 58 are no longer on a straight connecting line. On account of the shielding element 56, therefore, no communication can take place between the reading unit 48 and the transponder 44. The breaking off of the communication is detected by the evaluation logic 52 and reported to the safety switching device 20 via the connection 24. This device then switches off the robot 12.

In the exemplary embodiment represented in FIGS. 2 and 3, the actuator 38 together with the transponder 44 moves relative to the stationary reading unit 48 and stationary shielding element 56. As an alternative to this, the reading unit 48 and/or the shielding element 56 could be moved by means of the actuator 38.

In the exemplary embodiment shown in FIGS. 2 and 3, the clear inside diameter of the sleeve-shaped shielding element 56 is only slightly greater than the outside diameter of the actuator 38. As a consequence, the shielding element 56 in conjunction with the shielding bush 46 forms a virtually closed shielding of the transponder 44, when the actuator 38 is in the position shown in FIG. 3. The shielding bush 46 and the shielding element 56 are preferably produced at least partially from electrically conductive materials, here in particular copper or aluminum.

A pressure sensor, which in a modified exemplary embodiment is arranged in the operating button 32, is designated by the reference numeral 62 in FIG. 2. The output signal of the pressure sensor 62 is fed to the evaluation logic 52, in order to provide a second path for detecting operation.

Figure 4:
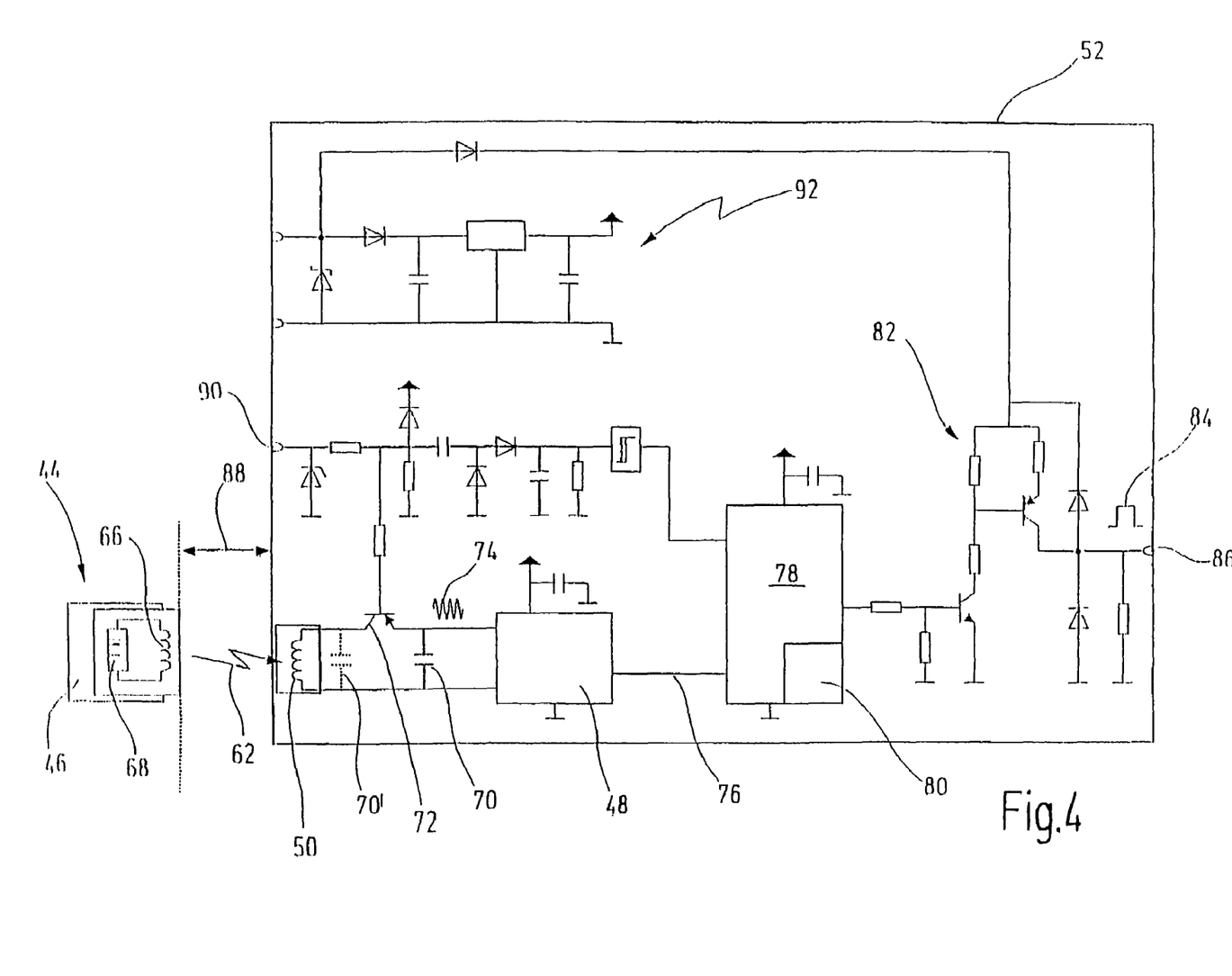
FIG. 4 shows a simplified circuit diagram of the transponder and the reading unit in the case of the safety switch from FIGS. 2 and 3.

In FIG. 4, the transponder 44 and the reading unit 48 are represented in a simplified electric circuit diagram. The same reference numerals respectively designate the same elements as before.

The transponder 44 has, in a way known per se, a transmitting and receiving coil 66 and also a memory, in which an individual transponder identification 68 is stored. The reading unit 48 is a commercially available integrated circuit for reading out the transponder identification 68. For the wireless communication, the reading unit 48 is connected to a resonant circuit, which comprises the above mentioned receiving coil 50 and a capacitor 70 arranged parallel to it. In the preferred exemplary embodiment, arranged between the coil 50 and the capacitor 70 is a transistor 72, by means of which the resonant circuit can be disconnected and thereby rendered functionally inoperative. The transistor 72 acts as a test element, by means of which the reading out of the transponder identification 68 can be "electronically" suppressed. As an alternative to the arrangement shown, the transistor 72 can also be connected in such a way that it separates the oscillating circuit comprising the coil 50 and the capacitor 70 from the reading unit 48, which is indicated by the reference numeral 70'.

In a way known per se, the reading unit 48 generates an electromagnetic interrogation signal by means of the resonant circuit 50, 70. If the transponder 44 is close enough to the resonant circuit 50, 70, it is activated by the signal and sends a reply signal, which carries the individual transponder identification 68 as information. This reply signal, indicated in FIG. 4 by reference numeral 74, is picked up by means of the resonant circuit 50, 70 and made available to the reading unit 48 for evaluation. The reading unit 58 reads out the individual transponder identification 68 from the reply signal 74 and makes it available to a microprocessor 78 via a connection 76. The microprocessor 78 has in an internal memory 80 a comparison value, on the basis of which it can check whether the transponder identification 68 read out coincides with the expected value. If this is the case, the microprocessor 78 outputs a corresponding output signal 78 at an output 86 via an amplifier circuit 82. The output signal 84 is fed to the safety switching device 22 via the connection 24.

As usual in the case of passive transponders, the reading out of the transponder identification 68 in this arrangement only functions as long as the transponder 44 is close enough to the transmitting and receiving circuit of the reading unit 48. A maximum distance within which reading out of the transponder identification 68 is possible is indicated in FIG. 4 by the reference numeral 88.

In the case of the novel safety switch 22, the transponder 44 and the transmitting and receiving circuit comprising the coil 50 and the capacitor 70 are arranged relative to one another in such a way that the maximum distance 88 in the second position (FIG. 3) of the actuator 38 is exceeded. By contrast, the transponder 44 is close enough to the reading unit 48 when the actuator 38 is in the first position (FIG. 2). When the actuator 38 is displaced from the first position into the second position, the communication between the transponder 44 and the reading unit 48 breaks off. This is detected by the microprocessor 78 and reported to the safety switching device 22 via the connection 24.

In FIG. 4, a test input, via which the safety switching device 20 can switch the transistor 72 on and off, is designated by the reference numeral 90. Since a reply signal 74 is no longer generated and cannot reach the reading unit 48, when the transistor 72 is switched off, this corresponds to the situation where the transponder 44 has been removed from the region of the reading unit 48. The microprocessor 78 must accordingly respond exactly as in the case where the actuator 38 has been removed. If it does not do so, the safety switching device 22 can detect this on the basis of the output signal 84 and switch the robot 12 off as a precautionary measure.

In the preferred exemplary embodiment, the emergency stop switch 22 has a supply voltage of its own, which is provided here via a voltage controller circuit 92. This makes it possible to operate the novel emergency stop switch 22 with different external supply voltages, which simplifies its installation in extensive installations.

Figure 5:
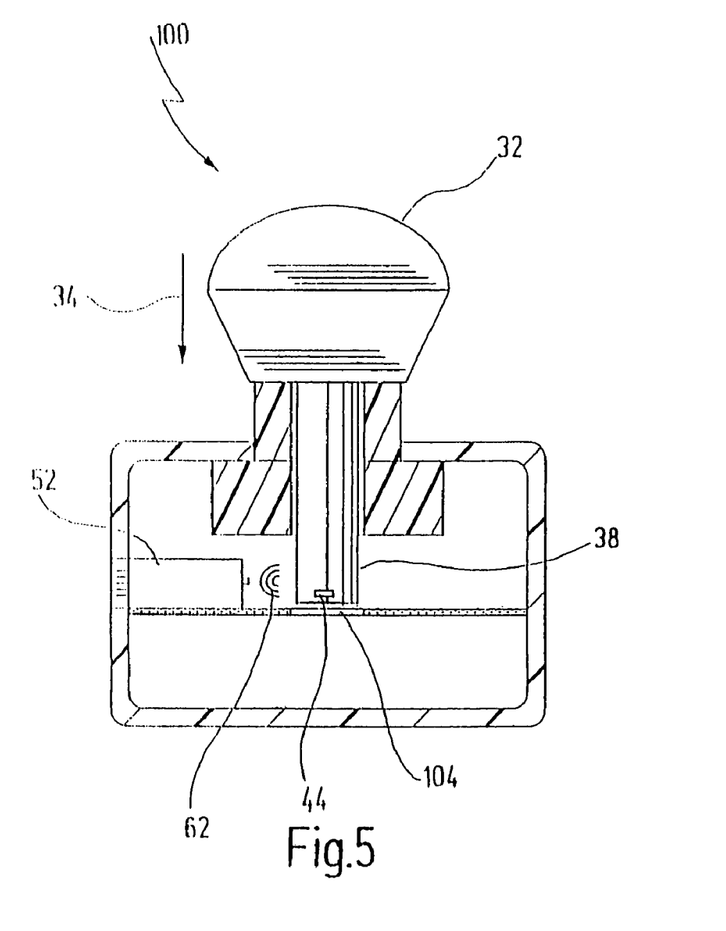
FIGS. 5 and 6 show a further exemplary embodiment of the novel safety switch in two different operating states.
Figure 6:
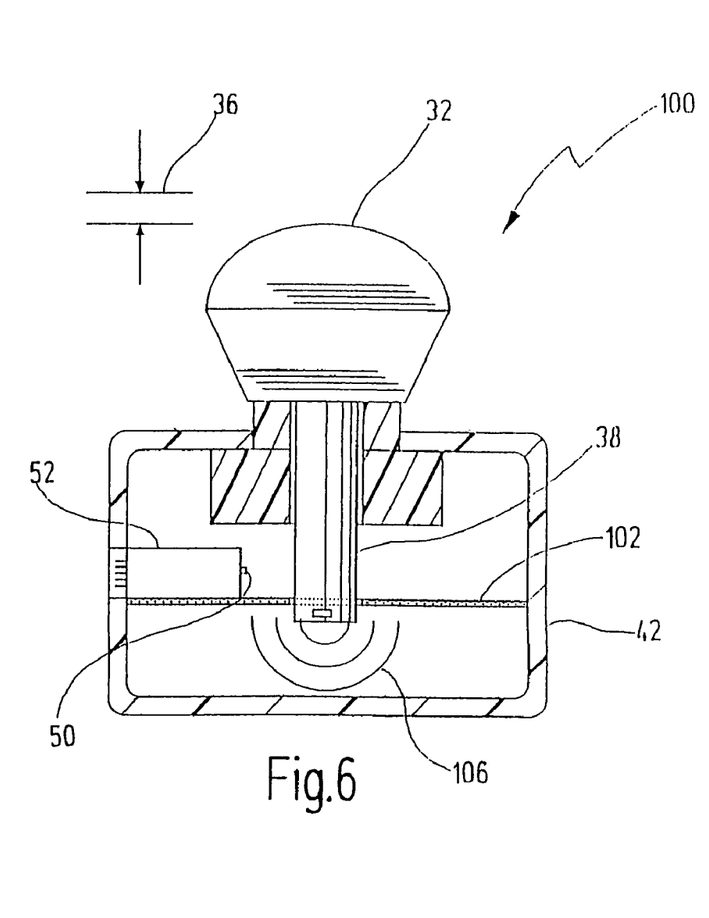

In FIGS. 5 and 6, a further exemplary embodiment of the novel safety switch is designated as a whole by the reference numeral 100. For sake of simplicity, once again the safety switch 100 is represented here as an emergency stop switch. The same reference numerals designate the same elements as before.

Instead of the sleeve-like shielding element 56 from FIG. 2, 3, the safety switch 100 has a shielding element 102 which here is substantially in the form of a plate. This is arranged substantially transversely in relation to the direction of movement 34 of the actuator 38 and has an opening 104 for the actuator 38 to pass through. The transponder 44 is once again fastened to the free end of the actuator 38.

In the inactive position represented in FIG. 5, the transponder 44 is above the shielding element 102, where the evaluation logic 52 with the reading unit 48 (not shown here) and the receiving coil 50 is also arranged. In this position, communication can take place between the transponder 44 and the reading unit 48, i.e. the reading unit 48 cyclically reads out the individual transponder identification from the transponder 44.

After the actuator 38 has been operated, on the other hand, the transponder 44 is underneath the shielding element 102. Moreover, the opening 104 is then closed by the actuator 38. As a consequence, the transponder 44 is then shielded from the reading unit 48. No communication can take place (indicated by reference numeral 106; for clarification, it should be pointed out that, in this position, no signals are emitted by the passive transponder 44, but instead the receiving coil 50 continues to transmit interrogation pulses). As an alternative to the representation shown here, the shielding element 102 may also be formed here in the form of a cup, the actuator 38 in the second position "entering" the corresponding cup.

Figure 7:
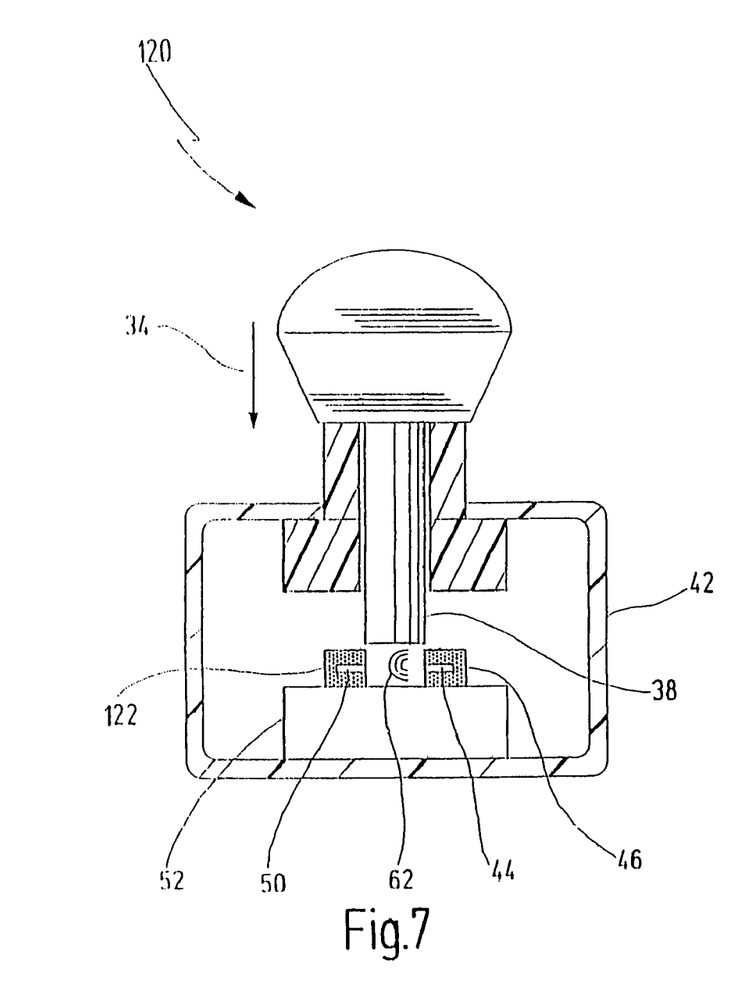
FIGS. 7 and 8 show a further exemplary embodiment of the novel safety switch in two different operating states.
Figure 8:
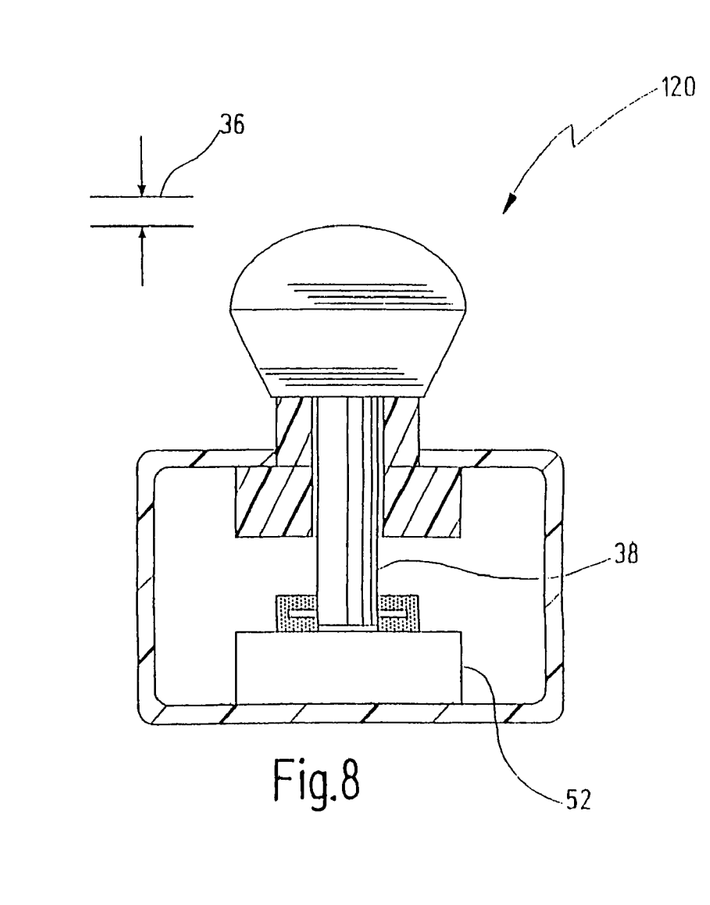

In FIGS. 7 and 8, a further exemplary embodiment of the novel safety switch is designated as a whole by the reference numeral 120. In this exemplary embodiment, both the reading unit with the receiving coil 50 and the transponder 44 are arranged such that they are fixed in place in the housing 42 of the safety switch 120. Both the transponder 44 and the receiving coil 50 are in this case adhesively bonded in a shielding bush 46 and 122, respectively. The transponder 44 and the receiving coil 50 lie diametrically opposite one another, the free end of the actuator 38 being able to enter the space remaining in between. In the non-operated position shown in FIG. 7, the actuator 38 does not disturb the communication between the transponder 44 and the reading unit 48. Accordingly, the reading unit 48 can cyclically read out the transponder identification. In the position shown in FIG. 8, on the other hand, the free end of the actuator 38 closes the two shielding bushes 46, 122, whereby the communication between the transponder 44 and the reading unit 48 is interrupted.

Figure 9:
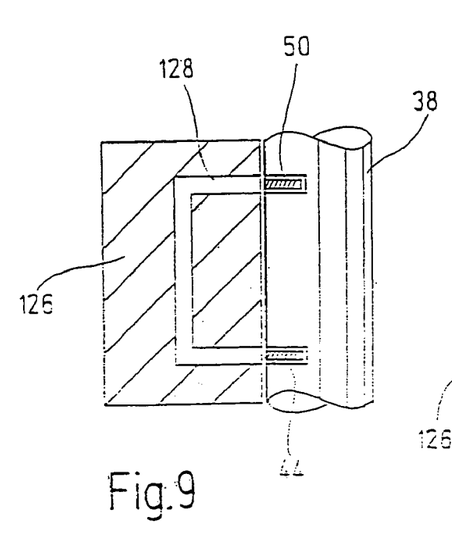
FIGS. 9 and 10 show a simplified basic representation for a further exemplary embodiment of the novel safety switch.
Figure 10:
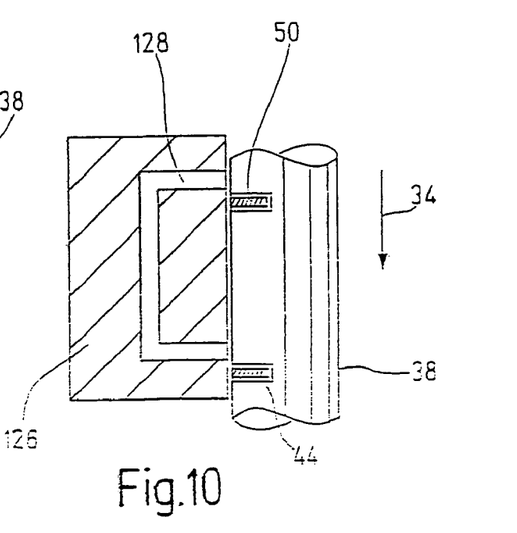

FIGS. 9 and 10 show a further exemplary embodiment of the novel safety switch. In this case, both the transponder 44 and the receiving coil 50 of the reading unit 48 are arranged on the movable actuator 38. A shielding element 126 is formed in such a way that it provides a signal path 128, over which the reading unit and the transponder can communicate with one another when the actuator 38 is in the position shown in FIG. 9. If, by contrast, the actuator 38 is displaced into its second position, the transponder 44 and the receiving coil 50 of the reading unit are no longer connected to the signal path 28. Therefore, the communication breaks off once again, which is correspondingly detected by the evaluation logic 52.

In a further exemplary embodiment, such a signal path may in principle also be used when the transponder and/or the reading unit are arranged separately from the actuator. The principle of providing a single defined signal path for the transmission, which breaks off when the actuator is displaced, is thereby retained.

In the exemplary embodiments from FIGS. 7, 8, 9 and 10, it is preferred if the actuator 38 itself is formed in such a way that electromagnetic signals are prevented from passing through, or at least damped. Depending on the frequencies used for the communication between the transponder and the reading unit, various materials that have sufficient damping at the respective frequency are known here to those skilled in the relevant art. At the frequency of 125 kHz, which is typical for commercially available transponders, an electrically conductive, but non-magnetic material is preferably used, such as aluminum, copper, silver or gold. For example, the copper cladding of a commercially available printed circuit board can be used to good effect.

What is claimed, is:

1. A mechanically operated, one-part safety switch for reliably switching off a dangerous device, the safety switch comprising:
    a housing having a receptacle,
    a mechanically operated actuator movably mounted in the receptacle between a first position and at least one second position, the actuator being located in the receptacle in both the first position and the at least one second position,
    a detector arranged in the housing for detecting the actuator in at least one of said first and second positions, the detector comprising a transponder having an individual transponder identification and a reading unit for wirelessly reading the transponder identification via electromagnetic signals, and
    a first shielding element for selectively shielding communication of the electromagnetic signals between the transponder and the reading unit,
    wherein at least one of the first shielding element, the transponder and the reading unit is movable as a function of the actuator, and
    wherein the transponder and the reading unit are arranged relative to one another in such a way that the reading unit is capable of reading the transponder in the first position but not in the second position.

2. The safety switch of claim 1, wherein the transponder is arranged on the actuator.

3. The safety switch of claim 1, wherein the first shielding element is arranged on the actuator.

4. The safety switch of claim 1, wherein the transponder and the reading unit define a substantially straight imaginary connecting line when in the first position, and wherein the first shielding element has an opening, which substantially lies on the imaginary connecting line in the first position.

5. The safety switch of claim 1, wherein the actuator defines a direction of movement, and wherein the first shielding element has a portion which runs substantially transversely in relation to the direction of movement, the first shielding element having an opening for the actuator to pass through in the direction of movement.

6. The safety switch of claim 1, wherein the first shielding element provides a predefined signal path for the transmission of an electromagnetic signal.

7. The safety switch of claim 1, further comprising a second shielding element for accommodating the transponder.

8. The safety switch of claim 7, wherein the second shielding element is a tubular shielding element that is open on one side, the transponder being arranged in the tubular shielding element.

9. The safety switch of claim 1, further comprising a further shielding element, wherein the reading unit has a receiving coil arranged in the further shielding element.

10. The safety switch of claim 1, further comprising a switching element for selectively suppressing the reading of the transponder identification.

11. The safety switch of claim 10, wherein the switching element is arranged in a region of the reading unit.

12. The safety switch of claim 1, wherein the first shielding element is an electrically conductive, non-ferromagnetic shielding element.

13. The safety switch of claim 1, further comprising a pressure sensor for detecting an operating pressure on the actuator.

14. The safety switch of claim 1, wherein the actuator is produced from a non-corroding material.

15. The safety switch of claim 1, wherein the actuator is encapsulated in a dust-free manner.

16. The safety switch of claim 1, wherein the safety switch is an emergency stop switch.

17. The safety switch of claim 1, wherein the first position is an inactive position of the actuator.

18. The safety switch of claim 12, wherein the first shielding element is made of aluminum, copper, silver, gold or a combination of these.

* * * * *